(12) United States Patent
Zhang et al.

(10) Patent No.: US 9,312,409 B2
(45) Date of Patent: Apr. 12, 2016

(54) INK FOR PRODUCING COMPOUND SEMICONDUCTOR THIN FILM, COMPOUND SEMICONDUCTOR THIN FILM PRODUCED USING THE INK, SOLAR CELL HAVING COMPOUND SEMICONDUCTOR THE THIN FILM, AND PROCESS FOR PRODUCING SOLAR CELL

(71) Applicant: TOPPAN PRINTING CO., LTD., Tokyo (JP)

(72) Inventors: Yiwen Zhang, Tokyo (JP); Akira Yamada, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 13/768,018

(22) Filed: Feb. 15, 2013

(65) Prior Publication Data

US 2013/0153033 A1 Jun. 20, 2013

Related U.S. Application Data

(63) Continuation of application No. PCT/JP2011/068462, filed on Aug. 12, 2011.

(30) Foreign Application Priority Data

Aug. 17, 2010 (JP) .................................. 2010-182529

(51) Int. Cl.
*H01B 1/02* (2006.01)
*H01L 31/0272* (2006.01)
(Continued)

(52) U.S. Cl.
CPC ...... *H01L 31/0272* (2013.01); *H01L 21/02568* (2013.01); *H01L 21/02601* (2013.01);
(Continued)

(58) Field of Classification Search
CPC .......................................................... H01B 1/02
USPC .......................................... 252/519.14, 519.4
See application file for complete search history.

(56) References Cited

U.S. PATENT DOCUMENTS

2010/0190292 A1* 7/2010 Alberts ......................... 438/102
2012/0138866 A1* 6/2012 Agrawal et al. ............ 252/501.1
(Continued)

FOREIGN PATENT DOCUMENTS

| JP | 64-17482 | 1/1989 |
| JP | 2007-503708 | 2/2007 |

(Continued)

OTHER PUBLICATIONS

International Preliminary Report on Patentability mailed Mar. 28, 2013 for corresponding International Application No. PCT/JP2011/068462.

(Continued)

*Primary Examiner* — Harold Pyon
*Assistant Examiner* — William Young

(57) ABSTRACT

An ink for forming a compound semiconductor thin film is provided, which contains a binder includes a compound includes an S atom or an Se atom and metallic compound particles which are both dispersed in an organic solvent. A compound semiconductor thin film is formed by applying or printing the ink for forming a compound semiconductor thin film and heat-treating it. A solar cell is constituted, which has a light-absorbing layer formed of the compound semiconductor thin film.

6 Claims, 2 Drawing Sheets

(51) Int. Cl.
  *H01L 21/02*      (2006.01)
  *H01L 31/032*     (2006.01)
  *H01L 31/0256*    (2006.01)

(52) U.S. Cl.
  CPC ...... *H01L21/02628* (2013.01); *H01L 31/0256* (2013.01); *H01L 31/0322* (2013.01); *H01B 1/02* (2013.01); *Y02E 10/541* (2013.01); *Y02P 70/521* (2015.11)

(56) References Cited

U.S. PATENT DOCUMENTS

2013/0316519 A1* 11/2013 Mitzi et al. .................... 438/478
2015/0118144 A1*  4/2015 Cao et al. ...................... 423/508

FOREIGN PATENT DOCUMENTS

| JP | 2009-76842 | 4/2009 |
| WO | WO 2010/027031 A1 | 3/2010 |
| WO | WO 2010/027032 * | 3/2010 |
| WO | WO 2010/027032 A1 | 3/2010 |
| WO | WO 2010/138636 A2 | 12/2010 |

OTHER PUBLICATIONS

International Search Report of Corresponding PCT Application PCT/JP2011/068462 mailed Sep. 6, 2011.

Qijie Guo et al., "Synthesis of $Cu_2ZnSnS_4$ Nanocrystal Ink and Its Use for Solar Cells", American Chemical Society, Jun. 17, 2009, pp. 11672-11673.

Japanese Office Action dated Jul. 28, 2015 in corresponding Japanese Patent Application No. 2012-529591.

* cited by examiner

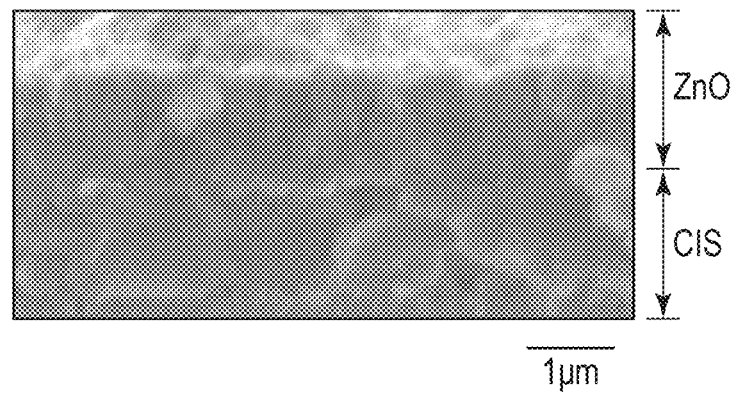
F I G. 2A
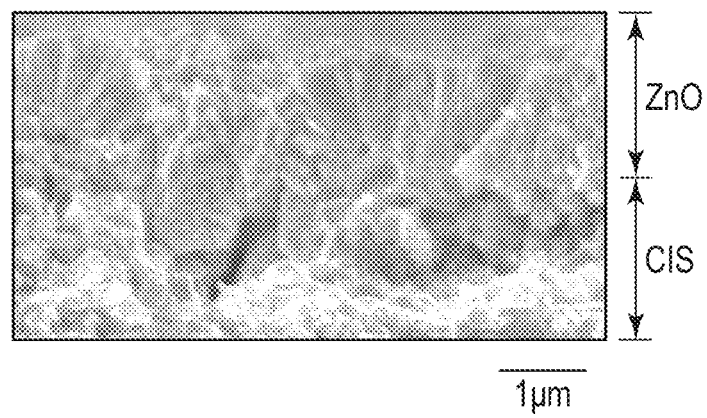
F I G. 2B

INK FOR PRODUCING COMPOUND SEMICONDUCTOR THIN FILM, COMPOUND SEMICONDUCTOR THIN FILM PRODUCED USING THE INK, SOLAR CELL HAVING COMPOUND SEMICONDUCTOR THE THIN FILM, AND PROCESS FOR PRODUCING SOLAR CELL

CROSS REFERENCE TO RELATED APPLICATIONS

This application is a Continuation Application of PCT Application No. PCT/JP2011/068462, filed Aug. 12, 2011 and based upon and claiming the benefit of priority from prior Japanese Patent Application No. 2010-182529, filed Aug. 17, 2010, the entire contents of all of which are incorporated herein by reference.

BACKGROUND OF THE INVENTION

1. Field of the Invention

The present invention relates to an ink for producing a compound semiconductor thin film to be used for producing, for example, a solar cell, a compound semiconductor thin film produced using the ink, a solar cell having the compound semiconductor thin film, and a process for producing the solar cell.

2. Description of the Related Art

A solar cell is a device which converts light energy into electrical energy using a photovoltaic effect and it has recently attracted attention from viewpoints of global warming prevention and substitutes for depleting resources.

The solar cell is classified roughly into a silicon-based solar cell (monocrystal, polycrystal, amorphous, and their composite), a compound semiconductor-based solar cell (CIS, CZTS, III-V group, and II-VI group compounds), an organic semiconductor-based solar cell, and a dye sensitization-based solar cell according to the kind of the material of a light-absorbing layer which is the most important constituent element. Among them, the CIS (CuInSe) compound semiconductor solar cell is expected as the next generation of solar cell which plays the part of resource saving and energy source for preventing warming because the cell has excellent characteristics such as high optical absorption coefficient of the light-absorbing layer, relatively few production process steps, high radiation hardness, and photoelectric conversion efficiency of more than 19% in a laboratory. Since rare metals are not used for the CZTS (CuZnSnS) compound semiconductor solar cell, it is expected as a low-cost solar cell of the future.

Currently, the light-absorbing layer which is the most important constituent element for the CIS compound semiconductor solar cell and the CZTS compound semiconductor solar cell is formed by, mainly a vacuum process such as vapor deposition or spattering. However, the vacuum process needs expensive vacuum facilities and the production process is also complicated. Thus, the process has a disadvantage of high power costs. There is also a disadvantage that it is difficult to maintain the uniformity of distribution of each element in the surface when forming a film having a large area.

Further reduction in power costs is essential to achieve the spread of the compound semiconductor solar cell. Recently, a method for forming a CIS layer or a CZTS layer by a method for forming a film at low cost such as a printing process has been suggested (see, for example, JP-A 2009-076842 (KOKAI) and Guo et al., J. Am. Chem. Soc., 131 (2009) 11672-11673.). According to the method, the process does not need an expensive vacuum device and the process becomes simple.

This may result in a significant reduction in power costs. The distribution of each element in the surface becomes uniform. It is also expected that the conversion efficiency is improved.

However, the method does not use a binder and crystallizes only nanoparticles by an annealing process. As a result, nanoparticles easily aggregate during the coating process, many gaps are present in the crystallized light-absorbing layer, the series resistance becomes high, and the conversion efficiency decreases. Because of no binder, there are problems such that the surface roughness is high, many defects are present on the surface, and the conversion efficiency decreases.

BRIEF SUMMARY OF THE INVENTION

The present invention has been achieved in view of the above circumstances. An object of the present invention is to provide an ink for producing a compound semiconductor thin film which allows solar cells to be produced at low cost, a process for producing thereof, a compound semiconductor thin film obtained using the ink, a solar cell having the compound semiconductor thin film, and a process for producing thereof.

According to the first embodiment of the present invention, there is provided an ink for forming a compound semiconductor thin film which includes a binder containing a compound containing an S atom or an Se atom and metallic compound particles which are both dispersed in an organic solvent.

According to the second embodiment of the present invention, there is provided a compound semiconductor thin film which is formed by applying or printing the ink for forming a compound semiconductor thin film according to the first embodiment and heat-treating it.

According to the second embodiment of the present invention, there is provided a solar cell which includes a light-absorbing layer formed of the compound semiconductor thin film according to the second embodiment.

According to the second embodiment of the present invention, there is provided a process for producing a solar cell which includes forming a compound semiconductor coating film by applying or printing the ink for forming a compound semiconductor thin film according to the first embodiment on an electrode formed on a substrate and forming a light-absorbing layer formed of the compound semiconductor thin film by heat-treating the compound semiconductor coating film.

BRIEF DESCRIPTION OF THE SEVERAL VIEWS OF THE DRAWING

FIG. 2A is a view showing the result on the cross section of a CIS layer according to an example which has been observed with an electronic scanning microscope; and FIG. 2B is a view showing the result on the cross section of a CIS layer according to a comparative example which has been observed with the electronic scanning microscope.

DETAILED DESCRIPTION OF THE INVENTION

Figure 1:
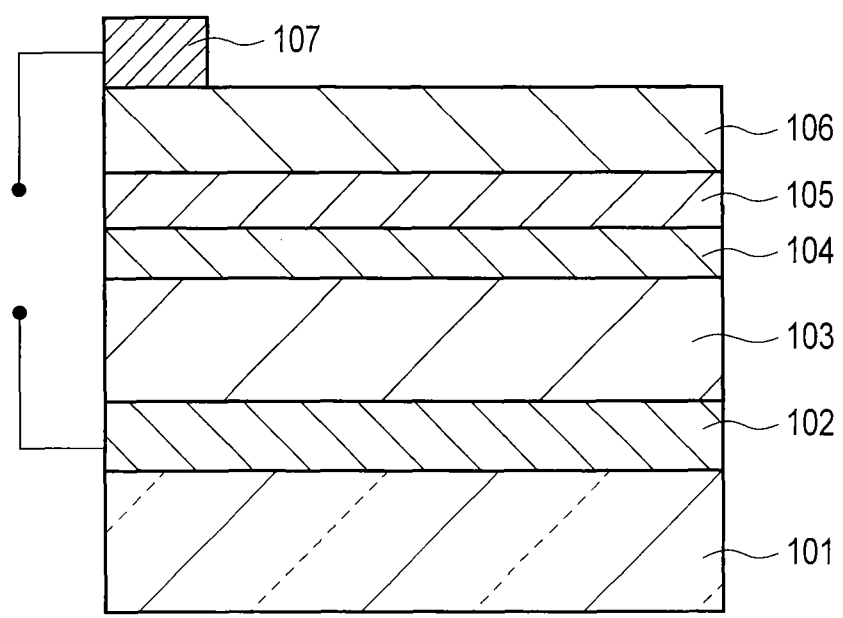
FIG. 1 is a vertical sectional side view schematically showing the configuration of a solar cell according to the third embodiment of the present invention.

Hereinafter, the embodiments of the present invention will be described with reference to the drawings.

First, the first embodiment of the present invention will be described.

The ink for producing a compound semiconductor thin film according to the first embodiment of the present invention includes a binder containing a compound containing an S atom or an Se atom and metallic compound particles which are both dispersed in an organic solvent. Such a binder is used for the ink for producing a compound semiconductor thin film so that the aggregation of metallic compound particles in the process of applying the ink for producing a compound semiconductor thin film can be prevented. The gaps between metallic compound particles are filled with the binder so that the gaps between the crystallized compound semiconductor thin films can be reduced. The surface of the formed compound semiconductor thin film becomes smooth by the surface smoothing effect of the binder, and thus the number of defects can be reduced. Since the binder containing a compound containing an S atom or an Se atom is compatible with metallic compound particles, particularly CIS particles or CZTS particles, and the S atom or Se atom has a facilitatory effect on crystal growth of CIS or CZTS, a fine crystal layer can be obtained.

Usable examples of the binder containing a compound containing an S atom or an Se atom include those represented by the following chemical formula.

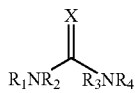

wherein X represents an S atom or an Se atom, and $R_1$, $R_2$, $R_3$, and $R_4$ independently represent a hydrogen atom or an alkyl group or an aryl group having 1 to 10 carbon atoms. $R_1$, $R_2$, $R_3$, and $R_4$ may be all the same groups or may be different from one another.

A binder containing a compound having a thiourea group has advantages of easily being dissolved in an organic solvent and prepared. There are advantages such that the thiourea group tends to be thermally decomposed and less remains in the crystallized film.

The number of carbon atoms of $R_1$, $R_2$, $R_3$, and $R_4$ in the formula is not limited to an alkyl group or aryl group having 1 to 10 carbon atoms. The number of carbon atoms may be 11 or more. If the number of carbon atoms becomes 11 or more, the binder is hardly decomposed in the following heat treatment process and remains in the film. Thus, the photoelectric conversion efficiency may be reduced. The alkyl group may be any of linear, branched, and cyclic. The aryl group may have a substituent on the phenyl group.

In addition to thiourea, specific examples of the compound represented by the chemical formula include tetramethylthiourea, tetraethylthiourea, phenylthiourea, isopropylthiourea, selenourea, dimethylselenourea, diethylselenourea, and 1-phenylselenourea. These compounds can be synthesized by known synthetic methods. The binders containing a compound containing an S atom or an Se atom may be used alone. Two or more of the binders may be combined and mixed for use.

The average particle diameter of metallic compound particles is preferably from 1 to 200 nm. If the average particle diameter of metallic compound particles becomes greater than 200 nm, gaps are easily formed in the compound semiconductor thin film in the process of heat-treating the compound semiconductor thin film, the surface roughness is high, and thus the photoelectric conversion efficiency tends to be reduced. On the other hand, when the average particle diameter of metallic compound particles is less than 1 nm, microparticles easily aggregate and thus it becomes difficult to prepare an ink.

The average particle diameter of metallic compound particles is more preferably from 5 to 100 nm. The average particle diameter is an average of the shortest diameter of metallic compound particles observed using a scanning electron microscope (SEM) or transmission electron microscope (TEM).

The metallic compound for forming metallic compound particles may be a compound containing at least one VIB group element. Examples of the metallic compound include $Cu_2O$, $CuSe$, $Cu_2S$, $CuTe$, $In_2S_3$, and $In_2Se_3$.

As the metallic compound particles, particles of a target compound semiconductor material or a material which becomes a compound semiconductor by reaction may be used. Examples thereof include $CuIn_xGa_{1-x}Se_2$ ($0\leq x\leq 1$) particles, $AgIn_xGa_{1-x}Se_2$ ($0\leq x\leq 1$) particles, $CuIn_xGa_{1-x}(Se_yS_{1-y})_2$ ($0\leq x\leq 1$, $0\leq y\leq 1$) particles, and $Cu_2ZnSn(S_xSe_{1-x})_4$ ($0\leq x\leq 1$) particles. Among them, $CuIn_xGa_{1-x}Se_2$ ($0\leq x\leq 1$) particles and $Cu_2ZnSn(S_xSe_{1-x})_4$ ($0\leq x\leq 1$) particles are preferred. The band gap in the CIS crystal can be appropriately changed by adjusting the proportion of In and Ga. The band gap in the CZTS crystal can be appropriately changed by adjusting the proportion of Se and S.

From the viewpoint of the Gibbs free energy of the reaction, in the CIS system, at least one substance of the group consisting of $Cu_{2-x}Se_{1-y}S_y$ ($0\leq x\leq 1$, $0\leq y\leq 1$) particles, $(In_xGa_{1-x})_2(Se_{1-y}S_y)_3$ ($0\leq x\leq 1$, $0\leq y\leq 1$) particles, and $In_xGa_{1-x}Se_{1-y}S_y$ ($0\leq x\leq 1$, $0\leq y\leq 1$) particles may be mixed for use.

In the CZTS system, at least one substance of the group consisting of $Cu_{2-x}Sn_{2-y}(Se_{1-z}S_z)_2$ ($0\leq x\leq 2$, $0\leq y\leq 2$, $0\leq z\leq 1$) particles and $Cu_{2-x}Zn_{2-y}(Se_{1-z}S_z)_2$ ($0\leq x\leq 2$, $0\leq y\leq 2$, $0\leq z\leq 1$) particles may be mixed for use. Among them, a mixture of $Cu_{2-x}Se_{1-y}S_y$ ($0\leq x\leq 1$, $0\leq y\leq 1$) particles, $Zn_{2-x}Se_{1-y}S_y$ ($0\leq x\leq 1$, $0\leq y\leq 1$) particles, and $Sn_{2-x}Se_{1-y}S_y$ ($0\leq x\leq 1$, $0\leq y\leq 1$) particles is preferred.

The binders containing a compound containing an S atom or an Se atom may be used alone or a plurality of kinds of the binders may be mixed for use.

The S/(S+Se) molar ratio of a mixture of the binder and the metallic compound particles is desirably from 0.05 to 0.9. When the S/(S+Se) molar ratio is less than 0.05, the amount of binder is low, and thus gaps are easily formed. If the molar ratio becomes greater than 0.9, metallic $Cu_2S$ is easily formed after heat treatment. Thus, the carrier concentration becomes high and the mixture tends to be difficult to be used as the light-absorbing layer.

The ink for forming a compound semiconductor thin film according to the first embodiment can be produced by dispersing the binder containing a compound containing an S atom or an Se atom and metallic compound particles in an organic solvent.

The organic solvent to be used is not particularly limited. Usable examples thereof include alcohol, ether, ester, aliphatic hydrocarbon, alicyclic hydrocarbon, and aromatic hydrocarbon. Preferable examples thereof include alcohol having less than 10 carbon atoms such as methanol, ethanol, butanol; diethyl ether, pentane, hexane, cyclohexane, and toluene. Particularly preferable examples thereof include methanol, pyridine, and toluene.

The ink according to this embodiment may contain a dispersant to efficiently disperse the binder containing a compound containing an S atom or an Se atom and metallic compound particles in an organic solvent. Examples of the dispersant include thiols, selenols, and alcohols having more than 10 carbon atoms.

Further, the ink according to this embodiment may contain another binder such as a silica binder to obtain a compound semiconductor thin film having high strength.

The concentration of the particles in the organic solvent is not particularly limited. Usually, it is from 1 to 20 wt %.

Subsequently, the second embodiment of the present invention will be described.

The compound semiconductor thin film according to the second embodiment of the present invention is formed by applying or printing the ink for forming a compound semiconductor thin film on a substrate, drying the substrate to remove an organic solvent, and heat-treating it.

Examples of the coating method include doctor coating, spin coating, slit coating, and spray coating. Examples of the printing method include gravure printing, screen printing, reverse offset printing, and relief printing.

The film thickness of the film formed by applying or printing the ink is preferably a thickness such that the film thickness of the compound semiconductor thin film after drying and heat treatment is 0.5 to 10 µm, for example, about 2 µm.

The heat treatment can be performed by annealing with a heating furnace as well as by rapid thermal annealing (RTA).

The heat treatment temperature is a temperature necessary for crystallization of the compound semiconductor. It is desirably 400° C. or more. When a glass substrate is used as the substrate, the temperature needs to be endurable for the glass substrate. Thus, it is desirably 600° C. or less, particularly 550° C. or less.

As described above, according to the second embodiment of the present invention, the compound semiconductor thin film is formed by applying and printing the ink for forming a compound semiconductor thin film produced by dispersing the binder containing a compound containing an S atom or an Se atom and metallic compound particles in an organic solvent, drying it, and heat-treating it. Accordingly, like when an ink containing only metallic compound particles dispersed in an organic solvent, is used as the conventional method, the disadvantage that gaps are easily formed is overcome. Thus, the conversion efficiency of the solar cell formed by using the compound semiconductor thin film as the light-absorbing layer can be improved.

Subsequently, the third embodiment of the present invention will be described.

FIG. 1 is a vertical sectional side view schematically showing the configuration of a solar cell according to the third embodiment of the present invention. In the solar cell shown in FIG. 1, a rear electrode 102 is formed on a substrate 101. As the substrate 101, soda lime glass, a metal plate, a plastic film or the like can be used. As the rear electrode 102, metals such as molybdenum (Mo), nickel (Ni), and copper (Cu), can be used.

As a light-absorbing layer 103, the compound semiconductor thin film according to the second embodiment is formed on the rear electrode 102. That is, the light-absorbing layer 103 is formed by applying the ink for forming a compound semiconductor thin film according to the first embodiment onto the rear electrode 102, drying it, and heat-treating it.

A buffer layer 104, an i-layer 105, and an n-layer 106 are sequentially formed on the light-absorbing layer 103. As the buffer layer 104, known CdS, Zn (S, O, OH), and $In_2S_3$ can be used. As the i-layer 105, a metal oxide such as the known ZnO, can be used. As the n-layer 106, ZnO to which the known Al, Ga, and B are added can be used.

Then, a surface electrode 107 is formed on the n-layer 106 to complete a solar cell. As the surface electrode 107, metals such as the known Al and Ag can be used.

Although it is not illustrated, it is possible to form an antireflection film which has a role in suppressing reflection of light and allowing a light-absorbing layer to absorb more light on the n-layer 106. The material of the antireflection film is not particularly limited. For example, magnesium fluoride ($MgF_2$) can be used. The film thickness of the antireflection film is suitably about 100 nm.

In the solar cell according to the third embodiment, the compound semiconductor thin film formed by applying and printing the ink for forming a compound semiconductor thin film produced by dispersing a binder containing a compound containing an S atom or an Se atom which can form a compound semiconductor and metallic compound particles, drying it, and heat-treating it is used as the light-absorbing layer. Accordingly, like a compound semiconductor thin film obtained by using an ink containing only metallic compound particles dispersed in an organic solvent as the conventional method, the disadvantage that gaps are easily formed is overcome. Thus, the conversion efficiency of the solar cell formed by using the compound semiconductor thin film as the light-absorbing layer can be improved.

Examples

Hereinafter, the present invention will be described in detail based on the examples, however, the present invention is not limited thereto.

(Synthesis of Cu—Se Nanoparticles)

A solution obtained by dissolving CuI in pyridine is mixed with a solution obtained by dissolving $Na_2Se$ in methanol. The resultant mixture is allowed to react at 0° C. in an inert gas atmosphere to synthesize Cu—Se nanoparticles. The reaction solution was filtered and washed with methanol. Thereafter, the obtained Cu—Se nanoparticles were dispersed in methanol.

(Synthesis of In—Se Nanoparticles)

A solution obtained by dissolving $InI_3$ in pyridine is mixed with a solution obtained by dissolving $Na_2Se$ in methanol. The resultant mixture is allowed to react at 0° C. in an inert gas atmosphere to synthesize In—Se nanoparticles. The reaction solution was filtered and washed with methanol. Thereafter, the obtained In—Se nanoparticles were dispersed in methanol.

(Preparation of Ink)

The obtained Cu—Se nanoparticle dispersion liquid and the In—Se nanoparticle dispersion liquid were mixed. As the binder containing an S atom, thiourea was added thereto. The mixture was prepared so that the Cu/In/Se/S molar ratio was 0.9/1/2.4/0.6. Methanol was further added thereto so that the solid content of the mixture was 5 wt % to prepare an ink.

Subsequently, a solar cell having the structure shown in FIG. 1 was produced in the following manner.

(Formation of the Rear Electrode 102)

A rear electrode 102 of a 0.6-µm-thick Mo layer was formed on a soda lime glass 101 using a sputtering method.

(Formation of the Light-Absorbing Layer 103)

The ink for forming a compound semiconductor thin film thus obtained was applied onto the rear electrode 102 by doctor coating. The solvent was evaporated in an oven at 250° C., followed by heating at 550° C. for 10 minutes to form a light-absorbing layer 103 of a 2-µm-thick CIS layer.

(Formation of the Buffer Layer 104)

The structural body having the light-absorbing layer 103 formed was immersed in a mixed solution (at 70° C.) containing cadmium sulfate ($CdSO_4$), thiourea ($NH_2CSNH_2$), and aqueous ammonia ($NH_4OH$) at molar concentrations of 0.0015 M, 0.0075 M, and 1.5 M, respectively. The buffer layer 104 of a 50-nm-thick CdS layer was formed on the light-absorbing layer 103.

(Formation of the i-Layer 105)

An i-layer 105 of a 50-nm-thick ZnO layer was formed on the buffer layer 104 by an MOCVD method using diethyl zinc and water as raw materials.

(Formation of the n-Layer 106)

An n-layer 106 of a 1-μm-thick ZnO:B layer was formed on the i-layer 105 by the MOCVD method using diethyl zinc, water, and diborane as raw materials.

(Formation of the Surface Electrode 107)

A surface electrode 107 of a 3-μm-thick Al layer was formed on the n-layer 106 by a vacuum deposition method.

Thus, a CIS solar cell was completed.

Comparative Example

A CIS solar cell was produced in the same manner as the example except that an ink prepared from a methanol dispersion liquid not containing thiourea as the binder and containing only 5 wt % of the Cu—Se and In—Se nanoparticles was used to form the light-absorbing layer 103.

The solar cells of the example and the comparative example were evaluated with a scanning electron microscope (SEM) and a standard sunlight simulator (light intensity: 100 mW/cm$^2$, air mass: 1.5).

FIG. 2A shows an SEM cross-sectional photograph of the example and FIG. 2B shows an SEM cross-sectional photograph of the comparative example. As is clear from these drawings, the particle diameter of the CIS layer according to the example is large and the layer has almost no gaps. On the other hand, the particle diameter of the CIS layer according to the comparative example is small and the layer has many gaps. In the photoelectric conversion efficiency, the photoelectric conversion efficiency of the solar cell according to the example is 3.2%, while the photoelectric conversion effect of the solar cell according to the comparative example is only 0.3%. This is because, in the solar cells according to the example, gaps in the CIS film are reduced by using the binder for coat-forming the light-absorbing layer, the surface becomes smooth, and this leads to improvement in conversion efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ink for forming a compound semiconductor thin film comprising:
    an organic solvent;
    a binder comprising a compound comprising an S atom or an Se atom, the binder being dispersed in the organic solvent; and
    metallic compound particles dispersed in the organic solvent, the metallic compound particles being a compound semiconductor comprising Cu, Zn, Sn and at least one of S and Se, wherein
    the compound comprising an S atom or an Se atom is represented by the following chemical formula:

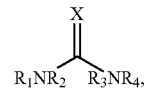

X represents an S atom or an Se atom, and $R_1$, $R_2$, $R_3$, and $R_4$ independently represent a hydrogen atom or an alkyl group or an aryl group having 1 to 10 carbon atoms,
    the metallic compound particles and the binder are such that
        the metallic compound particles contain an Se atom and the binder contains an S atom and optionally an Se atom,
        the metallic compound particles contain an S atom and the binder contains an Se atom and optionally an S atom, or
        the metallic compound particles contain an S atom and an Se atom and the binder contains at least one of an S atom and an Se atom, and
    an S/(S+Se) molar ratio of a mixture of the binder contained in the ink and the metallic compound particles is from 0.05 to 0.9.

2. The ink for forming a compound semiconductor thin film according to claim 1, wherein an average particle diameter of the metallic compound particles is from 1 to 200 nm.

3. The ink for forming a compound semiconductor thin film according to claim 1, wherein the metallic compound particles are $Cu_2ZnSn(S_xSe_{1-x})_4$ (0≤x≤1) particles.

4. A compound semiconductor thin film, which is formed by applying or printing the ink for forming a compound semiconductor thin film according to claim 1 and heat-treating it.

5. A solar cell comprising a light-absorbing layer formed of the compound semiconductor thin film according to claim 4.

6. A process for producing a solar cell comprising:
    forming a compound semiconductor coating film by applying or printing the ink for forming a compound semiconductor thin film according to claim 1 on an electrode formed on a substrate; and
    forming a light-absorbing layer formed of the compound semiconductor thin film by heat-treating the compound semiconductor coating film.

* * * * *